(12) United States Patent
Li et al.

(10) Patent No.: US 9,882,575 B1
(45) Date of Patent: Jan. 30, 2018

(54) ANALOG-TO-DIGITAL CONVERTER WITH OFFSET CALIBRATION

(71) Applicant: Analog Devices, Inc., Norwood, MA (US)

(72) Inventors: Hongxing Li, Andover, MA (US); Michael C. W. Coln, Lexington, MA (US); Michael Mueck, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/293,740

(22) Filed: Oct. 14, 2016

(51) Int. Cl.
*H03M 1/06* (2006.01)
*H03M 1/10* (2006.01)
*H03M 1/12* (2006.01)
*H03M 1/38* (2006.01)

(52) U.S. Cl.
CPC ....... *H03M 1/1023* (2013.01); *H03M 1/1245* (2013.01); *H03M 1/38* (2013.01)

(58) Field of Classification Search
CPC ........ H03M 31/1023; H03M 31/1245; H03M 31/38
USPC .................................. 341/118–155
See application file for complete search history.

(56) References Cited

U.S. PATENT DOCUMENTS

| | | | |
|---|---|---|---|
| 4,342,983 A * | 8/1982 | Weigand | H03M 1/10 341/120 |
| 4,641,129 A | 2/1987 | Doluca et al. | |
| 5,006,854 A | 4/1991 | White et al. | |
| 6,429,738 B1 * | 8/2002 | Kenington | 330/151 |
| 6,894,627 B2 | 5/2005 | Janakiraman et al. | |
| 7,006,028 B2 | 2/2006 | Galton | |
| 7,095,356 B1 * | 8/2006 | Pentakota | H03M 1/1245 341/150 |
| 7,113,117 B1 * | 9/2006 | Pentakota | H03M 1/0658 341/122 |
| 7,312,734 B2 | 12/2007 | McNeill et al. | |
| 7,609,184 B2 | 10/2009 | Kuramochi et al. | |
| 8,587,466 B2 | 11/2013 | Debnath et al. | |
| 8,653,998 B2 | 2/2014 | Haneda et al. | |
| 8,667,379 B2 * | 3/2014 | Haustein | G11B 20/10055 714/774 |
| 8,766,839 B2 | 7/2014 | Janakiraman et al. | |
| 9,054,727 B2 | 6/2015 | Steensgaard-Madsen | |
| 9,362,937 B1 | 6/2016 | Burgio et al. | |

(Continued)

OTHER PUBLICATIONS

Chiu, Yun, et al., "Digital Calibration of SAR ADC", *Proceedings of the 10th International Converence on Sampling Theory and Applications (SampTA 2013)*, [online]. Retrieved from the Internet: <URL:http://www.eurasip.org/Proceedings/Ext/SampTA2013/papers/p544-chiu.pdf>, (Jul. 2013), 544-547.

Hong, Hyeok-Ki, et al., "A 2.6b/cycle-Architecture-Based 10b 1.7 GS/s 15.4mW 4x-Time-Interleaved SAR ADC with a Multistep Hardware-Retirement Technique", *ISSCC 2015 / Session 26*,(2015), 3 pgs.

Kapusta, Ron, et al., "A 14b 80 MS/s SAR ADC With 73.6 dB SNDR in 65 nm CMOS", *IEEE Journal of Solid-State Circuits vol. 48, No. 12*, (Dec. 2013), 8 pgs.

(Continued)

*Primary Examiner* — Lam T Mai
(74) *Attorney, Agent, or Firm* — Schwegman Lundberg & Woessner, P.A.

(57) ABSTRACT

An analog-to-digital converter (ADC) circuit including error correction circuitry for correcting offset drifts in an ADC, such as a successive approximation register (SAR) ADC. The offset drifts can be reduced, such as by sampling the offset following an analog-to-digital conversion and subsequently providing an error correction signal based on the sampled offset.

20 Claims, 6 Drawing Sheets

(56) References Cited

U.S. PATENT DOCUMENTS

| | | | |
|---|---|---|---|
| 9,608,655 B1 | 3/2017 | Li et al. | |
| 2008/0238748 A1* | 10/2008 | Wu | H03M 1/0617 341/146 |
| 2008/0316080 A1* | 12/2008 | Yoshinaga | H03M 1/1023 341/158 |
| 2009/0201051 A1* | 8/2009 | Ono | G11C 27/026 327/96 |
| 2009/0243900 A1* | 10/2009 | Kawahito | H03M 1/144 341/118 |
| 2011/0012765 A1* | 1/2011 | Hsieh | G11C 27/024 341/143 |
| 2016/0277037 A1* | 9/2016 | Kajihara | H03M 13/2792 |

OTHER PUBLICATIONS

Liu, Chun-Cheng, et al., "A 10b 100MS/s 1.13mW SAR ADC with Binary-Scaled Error Compensation", *ISSCC 2010 / Session 21*, (2010), 3 pgs.

Liu, Wenbo, et al., "A 12-bit, 45-MS/s, 3-m W Redundant Successive-Approximation-Register Analog-to-Digital Converter With Digital Calibration", *IEEE Journal of Solid State Circuits, vol. 46, No. 11*, (Nov. 2011), 2661-2672.

Wang, Guanhua, et al., "IRD Digital Background Calibration of SAR ADC With Coarse Reference ADC Acceleration", *IEEE Transactions on Circuits and Systems-II: Express Breifs*, vol. 61, No. 1, (Jan. 2014), 11-15.

* cited by examiner

ANALOG-TO-DIGITAL CONVERTER WITH OFFSET CALIBRATION

FIELD OF THE DISCLOSURE

The present disclosure relates to systems and methods for providing error correction in an analog-to-digital converter (ADC).

BACKGROUND

Certain analog-to-digital converters (ADCs) include a digital-to-analog converter (DAC) that can sample an analog input voltage and provide a digital output. ADCs can be used in a wide variety of applications including audio and video recording, digital signal processing, and scientific instruments including radar, temperature sensors, and light intensity sensors.

SUMMARY OF THE DISCLOSURE

Analog-to-digital converters (ADCs), such as successive approximation register (SAR) ADCs can suffer from offset drift. Such offset drift can be due to capacitor mismatch drift, comparator offset drift, and pedestal effect error. Certain approaches for reducing or minimizing capacitor mismatch drift can include dynamic element matching and/or background calibration. Certain approaches for reducing or minimizing comparator offset drift can include auto-zeroing the comparator before using it. Pedestal effect error can arise from clock feedthrough or channel charge injection from one or more field-effect transistor (FET) switches used with a switched-capacitor DAC, and approaches for reducing or minimizing such pedestal error are described herein. In a high resolution, high accuracy SAR ADC, it can be challenging to reduce offset drifts to a level of less than a least significant bit (LSB) of the SAR ADC. The present inventors have recognized a need for providing an error correction signal, such as to reduce an offset drift of the SAR ADC, such as to reduce conversion errors at the output of the SAR ADC.

In an aspect, the disclosure can feature a method of providing error correction in an analog-to-digital conversion system. The method can include sampling a first analog signal, such as to introduce a first additive error to the sampled first analog signal. The method can also include converting the sampled first analog signal to a first digital value, such as to introduce a second additive error to the first digital value. The method can also include providing the first digital value to a first digital-to-analog converter (DAC). The method can also include converting the first digital value to a second analog signal, and the second analog signal can include the first analog signal and the first and second additive errors. The method can also include sampling the second analog signal, such as to introduce a third additive error to the sampled second analog signal. The method can also include converting the sampled second analog signal to a second digital value, such as to introduce a fourth additive error to the second digital value. The method can also include providing a digital error correction signal, such as that based on the difference between the first digital value and the second digital value. The first analog to digital converter (ADC) can convert the sampled first analog signal to the first digital value and a second ADC can convert the sampled second analog signal to the second digital value. An ADC can convert the sampled first analog signal to the first digital value, store the first digital value in a register, and then convert the sampled second analog signal to the second digital value. The method can also include digitally filtering the digital error correction value. The method can also include providing the digitally filtered error correction value to a second DAC. The method can also include converting the digitally filtered error correction value to an analog error correction signal. The method can also include adding the analog error correction signal to the sampled first analog signal. The first additive error and the third additive error can include contributions from a sampling pedestal effect.

In an aspect, the disclosure can feature a method of providing error correction in an analog-to-digital conversion system. The method can include sampling a first analog signal onto the first CDAC, such as to introduce a first additive error to the sampled first analog signal. The method can also include converting the sampled first analog signal into a first digital value, such as to introduce a second additive error to the first digital value. The method can also include storing the first digital value in the first CDAC, such as to produce a second analog signal. The method can also include sampling the second analog signal, such as to introduce a third additive error to the sampled second analog signal. The method can also include converting the sampled second analog signal into a second digital value, such as to introduce a fourth additive error to the second digital value. The method can also include providing a corrected digital value, such as that based on the difference between the first digital value and the second digital value. The method can also include providing a digital error correction value to the input of the first CDAC, such as to reduce an additive error introduced by sampling. The method can also include loading an upper portion of the first CDAC with a digital value, such as that based on the conversion of the first analog signal to a first digital value, then converting the second analog signal to a second digital value using a lower portion of the first CDAC. The method can also include providing a digital error correction value to the input of the lower portion of the first CDAC, such as to reduce an additive error introduced by sampling. A second CDAC can be coupled to the first CDAC and converting the second analog signal to a second digital value can be performed using the second CDAC. The method can also include providing a digital error correction value to the input of the second CDAC, such as to reduce an additive error introduced by sampling. The first additive error and the third additive error can include contributions from a pedestal effect.

In an aspect, the disclosure can feature an analog-to-digital conversion system for converting an analog signal to a digital value and providing error correction. The system can include a first capacitor digital-to-analog converter (CDAC) that can be configured to sample a first analog signal such as to introduce a first additive error to the sampled first analog signal. The system can also include an analog-to-digital converter (ADC) that can be configured to convert the sampled first analog signal to a first digital value, such as to introduce a second additive error to the first digital value. The system can also include a second CDAC configured to sample a third additive error, such as that created by the closing and re-opening of a sampling switch, and the ADC can convert the sampled third additive error to a second digital value, such as to introduce a fourth additive error to the second digital value. The system can also include a summation circuit that can be configured to provide a corrected ADC digital value, such as that based on the difference between the first digital value and the second digital value. The second CDAC can be further configured to receive an error correction value, such as that based on digitally filtered second digital values. The first additive error can be approximately equal to the third additive error and the second additive error can be approximately equal to the fourth additive error. The first CDAC can include capacitive elements corresponding to n digital bits and the second CDAC can include capacitive elements corresponding to m digital bits, and n can be greater than m.

In an aspect, the disclosure can feature an analog-to-digital conversion system for converting an analog signal to a digital value and providing error correction. The system can include a capacitor digital-to-analog converter (CDAC) that can be configured to sample a first analog signal, such as to introduce a first additive error to the sampled first analog signal. The system can also include an analog-to-digital converter (ADC) that can be configured to convert the sampled first analog signal to a first digital value, such as to introduce a second additive error to the first digital value. A lower portion of the CDAC can then be re-configured to sample a third additive error, such as that created by the closing and re-opening of a sampling switch. The ADC can convert the sampled third additive error to a second digital value, such as to introduce a fourth additive error to the second digital value. The system can also include a summation circuit that can be configured to provide a corrected ADC digital value, such as that based on the difference between the first digital value and the second digital value. The lower portion of the CDAC can be further configured to receive an error correction value, such as that based on digitally filtered second digital values. The first additive error can be approximately equal to the third additive error and the second additive error can be approximately equal to the fourth additive error.

Further features of the disclosure are provided in the detailed description and the appended claims, which features may optionally be combined with each other in any permutation or combination, unless expressly indicated otherwise elsewhere in this document.

BRIEF DESCRIPTION OF THE DRAWINGS

The present disclosure will now be described, by way of example, with reference to the accompanying drawings, in which.

DETAILED DESCRIPTION OF EMBODIMENTS
OF THE DISCLOSURE

Analog-to-digital converters (ADCs), such as successive approximation register (SAR) ADCs can sample an analog input voltage and provide a digital output. Certain SAR ADCs can suffer from offset drift. Such offset drift can be due to capacitor mismatch drift, comparator offset drift, and pedestal error. In a high resolution, high accuracy SAR ADC, it can be challenging to reduce offset drifts to a level of less than a least significant bit (LSB) of the SAR ADC. The present inventors have recognized a need for providing an error correction signal, such as to reduce an offset drift of the SAR ADC, such as to reduce conversion errors at the output of the SAR ADC.

Figure 1:
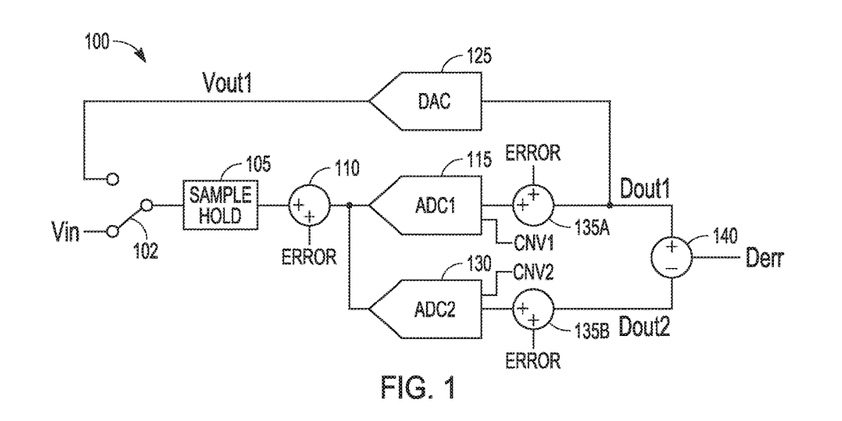
FIG. 1 is a functional block diagram of an example of an analog-to-digital converter (ADC) circuit and error correction circuitry.

FIG. 1 shows a functional block diagram of an example of an analog-to-digital converter (ADC) circuit and error correction circuitry 100. The ADC circuit and error correction circuitry 100 can include a switch 102, a sample and hold circuit 105, a first ADC circuit 115, a digital-to-analog converter (DAC) circuit 125, a second ADC circuit 130, and a summation circuit 140. The switch 102 can provide a connection from an analog input voltage ($V_{in}$) to an input of the sample and hold circuit 105. The switch 102 can also provide a connection from the output of DAC circuit 125 to the input of the sample and hold circuit 105. The output of the sample and hold circuit 105 can be connected to the first ADC circuit 115 and the second ADC circuit 130. The first ADC circuit 115 can be connected to the input of the DAC circuit 125 and to an input of the summation circuit 140. The second ADC circuit 130 can be connected to an input of the summation circuit 140. During operation, the switch 102 can connect an analog input voltage signal ($V_{in}$) to the input of the sample and hold circuit 105. The sample and hold circuit 105 can introduce an additive error represented conceptually at 110, such as that due to charge injection onto the sampled analog input voltage signal. In an example, the analog input voltage signal can be 1V and the sample and hold circuit can introduce and additive error of 0.1V, such as which can provide for a sampled analog input voltage signal of 1.1 V where the additive error of 0.1V introduced by the sample and hold circuit can add to the analog input voltage signal. The sampled analog input voltage signal and the additive error 110 introduced by the sample and hold circuit 105 can be provided to the input of the first ADC circuit 115. The first ADC circuit 115 can convert the sampled analog input voltage signal and the additive error 110 introduced by the sample and hold circuit 105 into a first digital value. The first digital value can include an additive error represented conceptually at 135A introduced by the ADC circuit 115, such as during the analog-to-digital conversion process. The first digital value can be provided to the input of the DAC circuit 125. The DAC circuit 125 can convert the first digital value into a first analog voltage that includes the sampled analog input voltage, the additive error 110 introduced by the sample and circuit 105, and the additive error 135A introduced by the first ADC circuit 115. The switch 102 can then be activated, such as to connect the first analog voltage to the input of the sample and hold circuit 105. The sample and hold circuit 105 can introduce an additional additive error 110, such as due to charge injection onto the sampled first analog voltage, and the sampled first analog voltage and the additional additive error 110 introduced by the sample and hold circuit 105 can be provided, such as to the input of the second ADC circuit 130. The second ADC circuit 130 can convert the sampled first analog voltage and the additional additive error 110 introduced by the sample and hold circuit 105 into a second digital value. The second digital value can include two additive errors 110, such as introduced by the sample and hold circuit 105, and two additive errors represented conceptually by 135A-B, such as respectively introduced by the first ADC circuit 115 and the second ADC circuit 130. The second digital value can be subtracted from the first digital value, such as by the summation circuit 140. Based on the subtraction, an error correction signal can be provided at the output of the summation circuit 140, and the error correction signal can include an additive error 110 such as that introduced by the sample and hold circuit 105 and an additive error 135A-B, such has that introduced by the first ADC circuit 115 or the second ADC circuit 130. The error correction signal can then be subtracted from the first digital value, such as to provide an error corrected analog-to-digital conversion of the analog input voltage signal (e.g., the first digital value where the additive errors such as those due to the sample and hold circuit 105 and the ADC circuit 115 have been subtracted). As described below with respect to FIG. 3, the error correction signal can be digitally filtered and provided to a second DAC and the digitally filtered error correction signal can be converted to an analog error correction signal for providing error correction in an analog-to-digital conversion, such as that using ADC circuit and error correction circuitry 100. In an example, the sample and hold circuit can include a capacitor and a switch. In the example, the switch can close such as to connect a voltage source to the capacitor, such as which can charge the capacitor to a voltage of the voltage source (e.g., 2V). After the capacitor has been charged to the voltage, the switch can be opened and the capacitor can remain charged. In an example, the summation circuit 140 can include an operational amplifier and a network of resistors. In an example, the summation circuit 140 can include a digital adder. In the example, the non-inverting terminal of the operational amplifier can be connected through a first resistor to a first voltage, and the inverting terminal of the operational amplifier can be connected through a second resistor to a second voltage. A third resistor can be connected from the non-inverting terminal of the operational amplifier to ground and a fourth resistor can be connected from the inverting terminal of the operational amplifier to an output terminal of the operational amplifier. In the example, the voltage at the output of the operational amplifier can be proportional to the difference between the first voltage and the second voltage.

Figure 2:
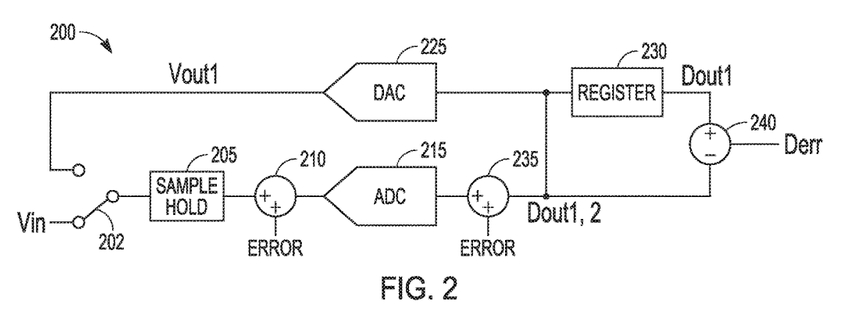
FIG. 2 is a functional block diagram of an example of an analog-to-digital converter (ADC) circuit and error correction circuitry.

FIG. 2 shows a functional block diagram of an example of an analog-to-digital converter (ADC) circuit and error correction circuitry 200. The ADC circuit and error correction circuitry 200 can include a switch 202, a sample and hold circuit 205, a first ADC circuit 215, a digital-to-analog converter (DAC) circuit 225, register circuit 230, and a summation circuit 240. The switch 202 can provide a connection from an analog input voltage to an input of the sample and hold circuit 205. The switch can also provide a connection from the output of DAC circuit 225 to the input of the sample and hold circuit 205. The output of the sample and hold circuit 205 can be connected to the first ADC circuit 215. The first ADC circuit 215 can be connected to in input of the register circuit 230, an input of the DAC 225, and to an input of the summation circuit 240. The output of the register circuit 230 can be connected to an input of the summation circuit 240. During operation, the switch 202 can connect an analog input voltage signal to the input of the sample and hold circuit 205. The sample and hold circuit 205 can introduce an additive error represented conceptually at 210, such as due to charge injection onto the sampled analog input voltage signal, and the sampled analog input voltage signal and the additive error 210 introduced by the sample and hold circuit 205 can be provided to the input of the first ADC circuit 215. The first ADC circuit 215 can convert the sampled analog input voltage signal and the additive error 210 introduced by the sample and hold circuit 205 into a first digital value. The first digital value can include an additive error represented conceptually at 235 introduced by the ADC circuit 215, such as during the analog-to-digital conversion process. The first digital value can be provided to the input of the register circuit 230 and to the input of the DAC circuit 225. The register circuit 230 can store the first digital value at an output of the register circuit 230 and provide the first digital value to an input of the summation circuit 240. The DAC circuit 225 can convert the first digital value into a first analog voltage that includes the sampled analog input voltage, the additive error 210 introduced by the sample and circuit 205, and the additive error 235 introduced by the first ADC circuit 215. The switch 202 can then be activated, such as to connect the first analog voltage to the input of the sample and hold circuit 205. The sample and hold circuit 205 can introduce an additional additive error 210, such as due to charge injection onto the sampled first analog voltage, and the sampled first analog voltage and the additional additive error 210 introduced by the sample and hold circuit 205 can be provided, such as to the input of the first ADC circuit 215. The first ADC circuit 215 can convert the sampled first analog voltage and the additional additive error 210 introduced by the sample and hold circuit 205 into a second digital value. The second digital value can include two additive errors 210, such as introduced by the sample and hold circuit 205, and two additive errors 235, such as introduced by the first ADC circuit 215. The second digital value can be subtracted from the first digital value, such as by the summation circuit 240. Based on the subtraction, an error correction signal can be provided at the output of the summation circuit 240, and the error correction signal can include an additive error 210 such as that introduced by the sample and hold circuit 205 and an additive error 235, such has that introduced by the first ADC circuit 215. The error correction signal can be digitally filtered (e.g., such as shown in FIG. 3) and provided to a second DAC and the digitally filtered error correction voltage signal can be converted to an analog error correction signal for providing error correction in an analog-to-digital conversion, such as that using ADC circuit and error correction circuitry 200.

Figure 3:
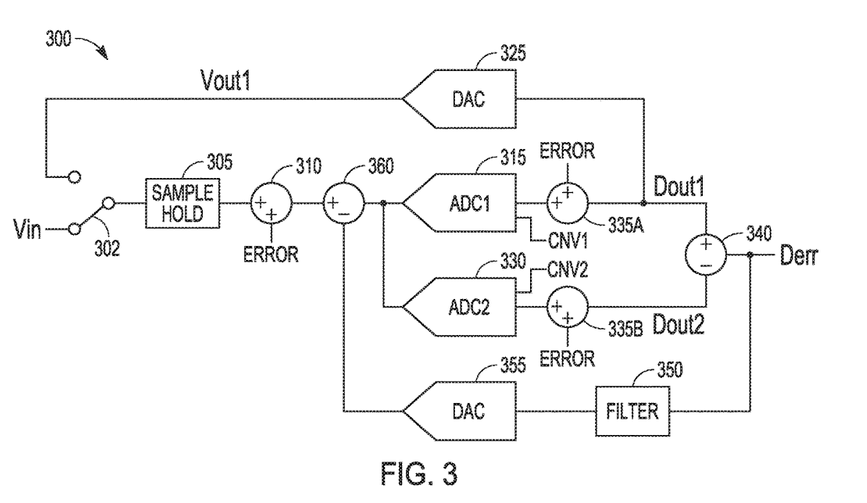
FIG. 3 is a functional block diagram of an example of an analog-to-digital converter (ADC) circuit and error correction circuitry.

FIG. 3 shows a functional block diagram of an analog-to-digital converter (ADC) circuit and error correction circuitry 300. The ADC circuit and error correction circuitry 300 can include a switch 302, a sample and hold circuit 305, a first ADC circuit 315, a digital-to-analog converter (DAC) circuit 325, a second ADC circuit 330, a summation circuit 340, digital filter 350, a second DAC 355, and a summation circuit 360. The switch 302 can provide a connection from an analog input voltage to an input of the sample and hold circuit 305. The switch can also provide a connection from the output of DAC circuit 325 to the input of the sample and hold circuit 305. The output of the sample and hold circuit 305 can be connected to the first ADC circuit 315, the second ADC circuit 330, and the summation circuit 360. The first ADC circuit 315 can be connected to in input of the DAC circuit 325 and to an input of the summation circuit 340. The second ADC circuit 330 can be connected to an input of the summation circuit 340. The output of the summation circuit 340 can be connected to an input of the digital filter 350. The output of the digital filter 350 can be connected to the input of the second DAC 355. The output of the second DAC 355 can be connected to the summation circuit 360. During operation, the switch 302 can connect an analog input voltage signal to the input of the sample and hold circuit 305. The sample and hold circuit 305 can introduce an additive error represented conceptually at 310, such as due to charge injection onto the sampled analog input voltage signal, and the sampled analog input voltage signal and the additive error 310 introduced by the sample and hold circuit 305 can be provided to the input of the first ADC circuit 315. The first ADC circuit 315 can convert the sampled analog input voltage signal and the additive error 310 introduced by the sample and hold circuit 305 into a first digital value. The first digital value can include an additive error represented conceptually at 335A introduced by the ADC circuit 315, such as during the analog-to-digital conversion process. The first digital value can be provided to the input of the DAC circuit 325. The DAC circuit 325 can convert the first digital value into a first analog voltage that includes the sampled analog input voltage, the additive error 310 introduced by the sample and circuit 305, and the additive error 335 introduced by the first ADC circuit 315. The switch 302 can then be activated, such as to connect the first analog voltage to the input of the sample and hold circuit 305. The sample and hold circuit 305 can introduce an additional additive error 310, such as due to charge injection onto the sampled first analog voltage, and the sampled first analog voltage and the additional additive error 310 introduced by the sample and hold circuit 305 can be provided, such as to the input of the second ADC circuit 330. The second ADC circuit 330 can convert the sampled first analog voltage and the additional additive error 310 introduced by the sample and hold circuit 305 into a second digital value. The second digital value can include two additive errors 310, such as introduced by the sample and hold circuit 305, and two additive errors represented conceptually by 335A-B, such as respectively introduced by the first ADC circuit 315 and the second ADC circuit 330. The second digital value can be subtracted from the first digital value, such as by the summation circuit 340. Based on the subtraction, an error correction signal can be provided at the output of the summation circuit 340, and the error correction signal can include an additive error 310 such as that introduced by the sample and hold circuit 305 and an additive error 335, such has that introduced by the first ADC circuit 315 or the second ADC circuit 330. The error correction signal can be provided to the digital filter 350. The digital filter 350 can provide a digitally filtered version of the error correction signal to the input of the second DAC 355. The second DAC 355 can convert the digitally filtered error correction signal into an analog error correction voltage signal. The analog error correction voltage signal can be provided to the summation circuit 360 and the summation circuit can subtract the analog error correction signal from the sampled analog input voltage signal and the additive error 310 provided at the output of the sample and hold circuit. In an example, the digital filter 350 can include a $1^{st}$ order, low-pass, infinite-impulse-response (IIR) filter. In an example, the digital filter 350 can be an averaging filter. In an example, the digital filter can include an IIR filter of any order, a finite-impulse-filter having any number of taps and coefficients for those taps. The digital filter can be selected such as to minimize noise in the error correction signal, respond quickly to changes in the error correction signal, and minimize area and power in a circuit.

Figure 4:
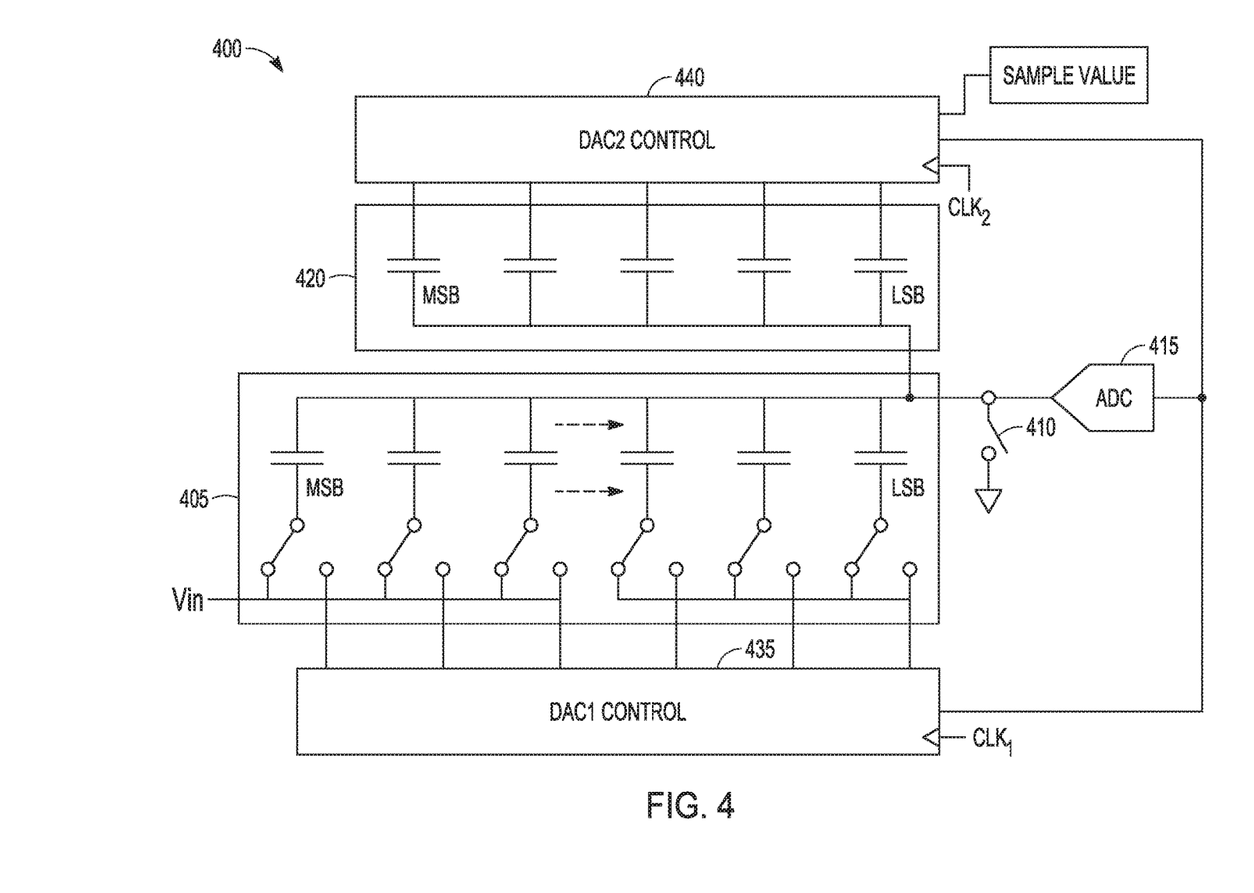
FIG. 4 illustrates an example of an analog-to-digital converter (ADC) circuit and error correction circuitry.

FIG. 4 shows an analog-to-digital converter (ADC) circuit and error correction circuitry 400. The ADC circuit and error correction circuitry 400 can include a first capacitor digital-to-analog converter (CDAC) 405, a sampling switch 410, an ADC circuit 415, a second CDAC 420, a first DAC control circuit 435, a second DAC control circuit 440. The first CDAC 405 can be connected to the first DAC control circuit 435, the sampling switch 410, and to the input of the ADC circuit 415. The output of the ADC circuit 415 can be connected to the first DAC control circuit 435 and the second DAC control circuit 440. The second CDAC 420 can be connected to the second DAC control circuit 440, the sampling switch 410, and to the input of the ADC circuit 415. During operation, a first clock can be provided to the first DAC control circuit 435 and a second clock can be provided to the second DAC control circuit 440 to facilitate operation of the ADC circuit and error correction circuitry 400. The first CDAC 405 can be configured to sample a first analog voltage, such as by closing the sampling switch 410 and connecting internal switches within the first CDAC 405 to the first analog voltage. After the first analog voltage has been sampled, the sampling switch 410 can be opened and the internal switches within the first CDAC 405 can be disconnected from the first analog voltage, such as to provide a sampled first analog voltage at the input of the ADC circuit 415. The closing and re-opening of the sampling switch 410 can introduce an additive error (which can sometimes be referred to as a pedestal error) onto the sampled first analog voltage, such as due to charge injection (e.g., the first analog voltage can be 2.1V, the additive error can be 0.1V, and the sampled first analog voltage can be 2.2V). The ADC circuit 415 can convert the sampled first analog voltage to a first digital value. The ADC circuit 415 can introduce an additive error onto the sampled first analog voltage (e.g., the sampled first analog voltage can be 2.2V, the additive error can be 0.1V, and the first digital value can represent 2.3V). The ADC circuit 415 can include a comparator circuit as shown in FIG. 4A. The first digital value can be loaded onto capacitive elements of the first CDAC 405, and a voltage at the input of the ADC circuit 415 can have a magnitude of less than one half of a least-significant bit of the first CDAC 405 after conversion of the sampled first analog voltage to the first digital value. After conversion of the sampled first analog voltage to the first digital value, the sampling switch 410 can be closed and then re-opened, such as to sample an additive error, such as caused by charge injection, onto the second CDAC 440. The ADC circuit 415 can then convert the sampled additive error into a second digital value. The ADC circuit 415 can introduce an additive error onto the sampled additive error (e.g., the sampled additive error can be 0.1V, the additive error can be 0.1V, and the second digital value can represent 0.2V). The second digital value can be loaded onto capacitive elements of the second CDAC 440, and a voltage at the input of the ADC circuit 415 can have a magnitude of less than one half of a least-significant bit of the second CDAC 440 after conversion of the sampled additive error to the second digital value. In an example, the second digital value can be subtracted from the first digital value such as to provide correction of errors, such as those introduced by sampling switch 410 and ADC circuit 415. In an example, an analog voltage based on the second digital value can be applied to the input of the ADC circuit 415 during sampling of the first analog voltage to provide cancellation of errors, such as those introduced by sampling switch 410 and ADC circuit 415. In an example, the ADC circuit 415 can include a comparator. In an example, the first CDAC 405 can be part of a first SAR ADC, and the second CDAC 420 can be part of a second SAR ADC. In an example, the first CDAC 405 can include capacitive elements corresponding to n digital bits, and the second CDAC 420 can include capacitive elements corresponding to m digital bits, and n can be greater than m. In an example the resolution of a CDAC can be determined by the number of digital bits represented by the CDAC (e.g., the resolution of a CDAC can be finer for a greater number of digital bits).

Figure 5A:
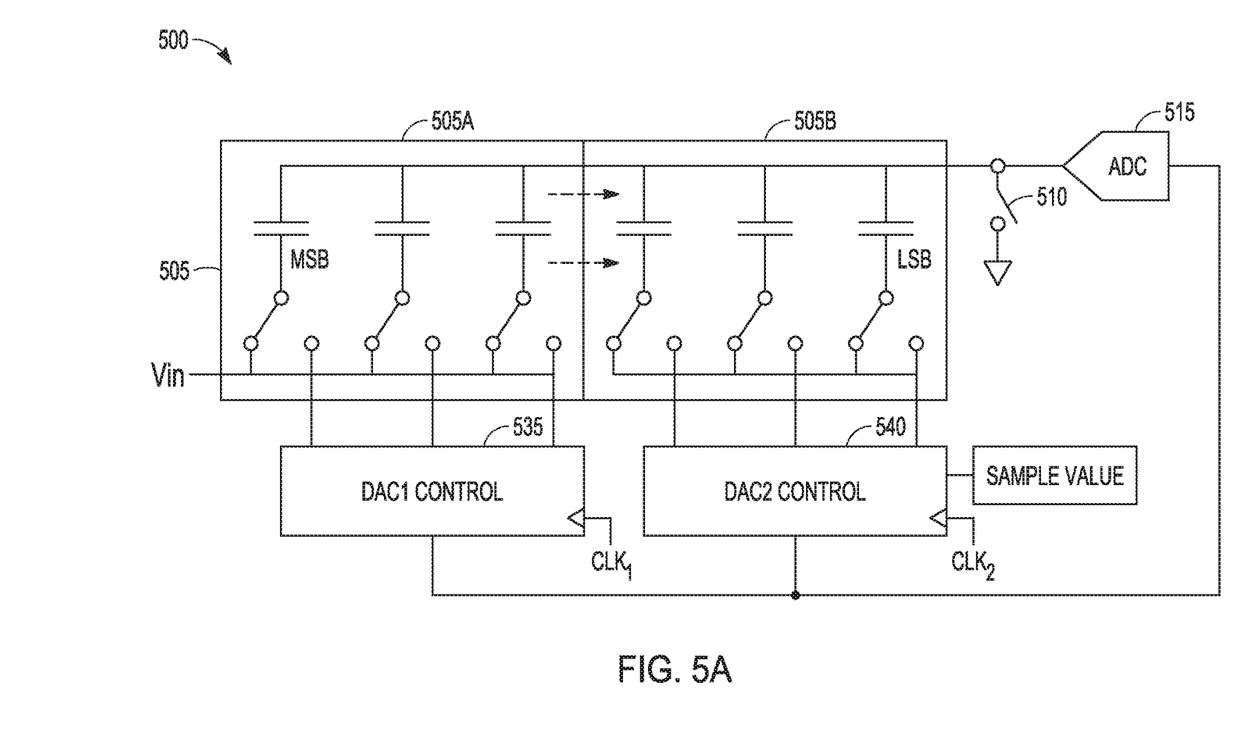
FIG. 5A illustrates an example of an analog-to-digital converter (ADC) circuit and error correction circuitry.
Figure 5B:
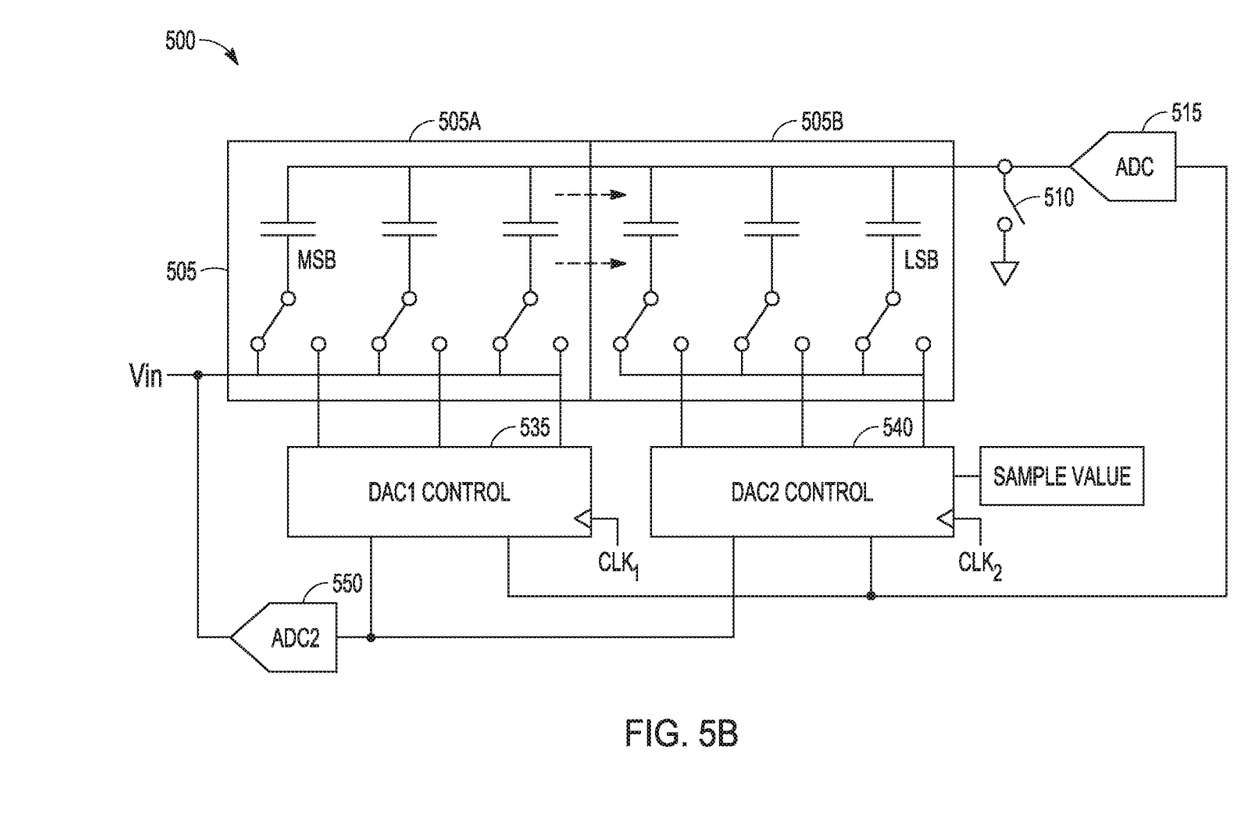
FIG. 5B illustrates an example of an analog-to-digital converter (ADC) circuit and error correction circuitry.
Figure 5C:
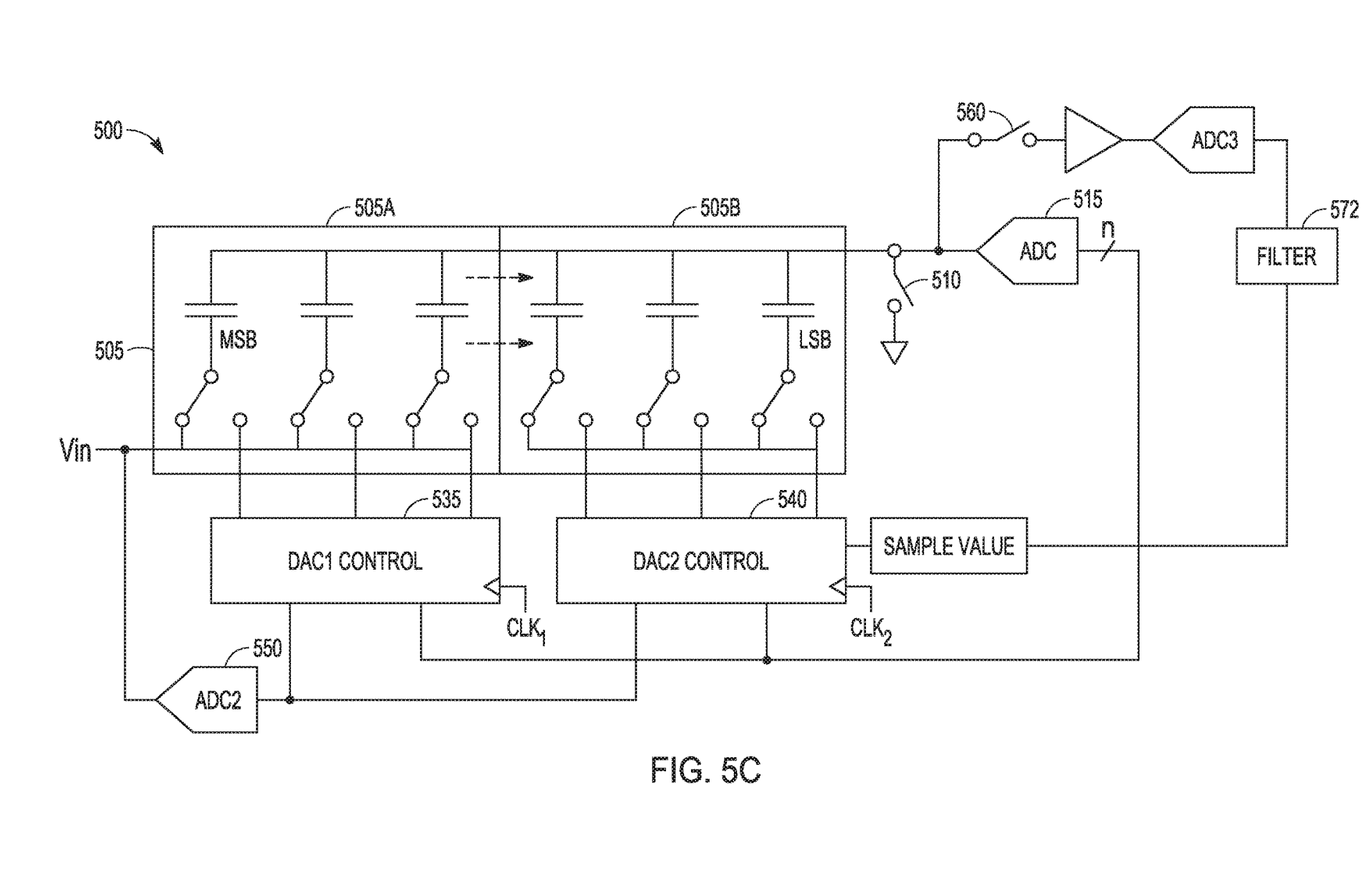
FIG. 5C illustrates an example of an analog-to-digital converter (ADC) circuit and error correction circuitry.

FIG. 5A shows an analog-to-digital converter (ADC) circuit and error correction circuitry 500. The ADC circuit and error correction circuitry 500 can include a capacitor digital-to-analog converter (CDAC) 505, a sampling switch 510, an ADC circuit 515, a first DAC control circuit 535, and a second DAC control circuit 540. The CDAC 505 can include a first portion 505a and a second portion 505b. The CDAC 505 can be connected to the first DAC control circuit 535, the second DAC control circuit 540, the sampling switch 510, and to the input of the ADC circuit 515. The output of the ADC circuit 515 can be connected to the first DAC control circuit 535 and the second DAC control circuit 540. During operation, a first clock can be provided to the first DAC control circuit 535 and a second clock can be provided to the second DAC control circuit 540 to facilitate operation of the ADC circuit and error correction circuitry 500. The CDAC 505 can be configured to sample a first analog voltage, such as by closing the sampling switch 510 and connecting internal switches within the CDAC 505 to the first analog voltage. After the first analog voltage has been sampled, the sampling switch 510 can be opened and the internal switches within the CDAC 505 can be disconnected from the first analog voltage, such as to provide a sampled first analog voltage at the input of the ADC circuit 515. The closing and re-opening of the sampling switch 510 can introduce an additive error onto the sampled first analog voltage, such as due to charge injection (e.g., the first analog voltage can be 2.1V, the additive error can be 0.1V, and the sampled first analog voltage can be 2.2V). The ADC circuit 515 can convert the sampled first analog voltage to a first digital value. The ADC circuit 515 can introduce an additive error onto the sampled first analog voltage (e.g., the sampled first analog voltage can be 2.2V, the additive error can be 0.1 V, and the first digital value can represent 2.3V). The first digital value can be loaded onto capacitive elements of the CDAC 505, and a voltage at the input of the ADC circuit 515 can have a magnitude of less than one half of a least-significant bit of the CDAC 505 after conversion of the sampled first analog voltage to the first digital value. After conversion of the sampled first analog voltage to the first digital value, the sampling switch 510 can be closed and then re-opened, such as to sample an additive error, such as caused by charge injection, onto the second portion of the CDAC 505b. The ADC circuit 515 can then convert the sampled additive error into a second digital value. The ADC circuit 515 can introduce an additive error onto the sampled additive error (e.g., the sampled additive error can be 0.1V, the additive error can be 0.1V, and the second digital value can represent 0.2V). The second digital value can be loaded onto capacitive elements of the second portion of the CDAC 505b, and a voltage at the input of the ADC circuit 515 can have a magnitude of less than one half of a least-significant bit of the second portion of the CDAC 505b after conversion of the sampled additive error to the second digital value. In an example, the second digital value can be subtracted from the first digital value such as to provide correction of errors, such as those introduced by sampling switch 510 and ADC circuit 515. In an example, an analog voltage based on the second digital value can be applied to the input of the ADC circuit 515 during sampling of the first analog voltage to provide cancellation of errors, such as those introduced by sampling switch 510 and ADC circuit 515. In an example, the ADC circuit 515 can include a comparator. In an example, the CDAC 505 can be part of a SAR ADC. In an example, such as that shown in FIG. 5B, the ADC circuit and error correction circuitry 500 can include an auxiliary ADC 550. The auxiliary ADC can sample the first analog voltage (Vin) and can convert the sampled first analog voltage to an auxiliary digital output. The auxiliary digital output can be provided to the first DAC control circuit 535 and the second DAC control circuit 540. Based on the auxiliary digital output, the first DAC control circuit 535 and the second DAC control circuit 540 can load charge onto capacitive elements corresponding to the first few most significant bits (MSBs) of the first CDAC 505a and the second CDAC 505b, respectively. In an example, such as that shown in FIG. 5C, the ADC circuit and error correction circuitry 500 can include a switch 560, an amplifier 564, a second ADC circuit 568, and a filter 572. During operation, after conversion of the sampled first analog voltage to the first digital value by the ADC circuit 515, the voltage at the input of the ADC circuit 515 can be provided to the amplifier 564, such as by closing the switch 560. The amplifier 564 can provide an amplified signal to the ADC circuit 568. The ADC circuit 568 can convert the amplified signal to a digital value. The digital value can be filtered by digital filter 572 and then be provided to the DAC control circuit 540 and loaded onto capacitive elements of the CDAC 505, such as to improve the accuracy of the conversion of the analog input to a digital value. In an example, the digitally filtered value can be provided to the second DAC control circuit 540 and the digitally filtered values can be loaded onto the second portion of CDAC 505b.

Figure 6:
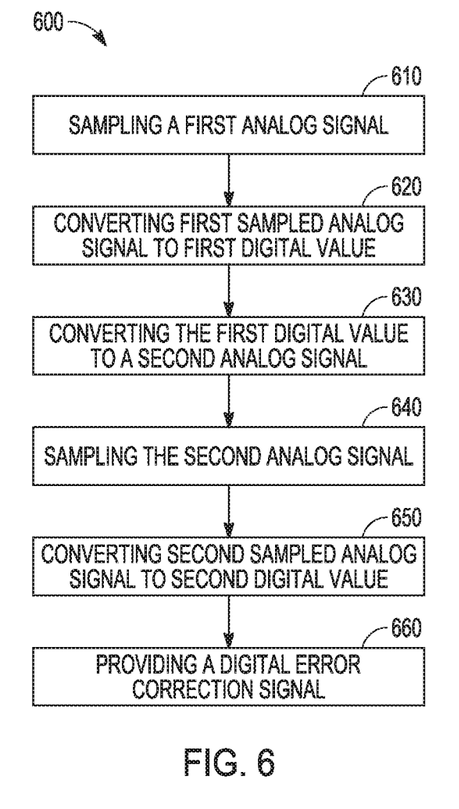
FIG. 6 illustrates a diagram of a method of error correction in an analog-to-digital converter (ADC) circuit.

FIG. 6 shows a method of providing error correction in an analog-to-digital converter (ADC) such as that shown in FIG. 1. The sample and hold circuit 102 can sample a first analog signal (Vin) and can introduce a first additive error represented at 110 (step 610). The ADC 115 can convert the sampled first analog signal to a first digital value and can introduce a second additive error represented at 135 (step 620). The DAC 125 can convert the first digital value to a second analog signal that can include the first analog signal and the first and second additive errors (step 630). The sample and hold circuit 102 can sample the second analog signal and can introduce a third additive error (step 640). The ADC 130 can convert the sampled second analog signal to a second digital value and can introduce a fourth additive error (step 650). The summation circuit 140 can provide a digital error correction signal based on the difference between the first digital value and the second digital value (step 660).

The invention claimed is:

1. A method of providing error correction in an analog-to-digital conversion system, the method comprising:
    sampling a first analog signal using a sampling switch, and converting the sampled first analog signal into a first digital value;
    sampling a second analog signal that includes a digital-to-analog conversion of the first digital value wherein, the sampling including closing and re-opening of the sampling switch, converting the sampled second analog signal into a second digital value; and
    providing a digital error correction signal based on a difference between the first digital value and the second digital value.

2. The method of claim 1 further comprising converting the sampled first analog signal to the first digital value using a first analog to digital converter (ADC) and converting the sampled second analog signal to the second digital value using a second ADC.

3. The method of claim 1 further comprising converting the sampled first analog signal to the first digital value using an ADC, storing the first digital value in a register, and then converting the sampled second analog signal to the second digital value.

4. The method of claim 1 further comprising digitally filtering the digital error correction value.

5. The method of claim 4 further comprising:
providing the digitally filtered error correction value to a digital-to-analog converter (DAC);
converting the digitally filtered error correction value to an analog error correction signal; and
adding the analog error correction signal to the sampled first analog signal.

6. The method of claim 1 wherein the first digital value includes a first additive error introduced by sampling the first analog signal, the second digital value includes a second additive error introduced by sampling the second analog signal, and the first additive error and the third additive error include contributions from a sampling pedestal effect.

7. A method of providing error correction in an analog-to-digital conversion system, the system including a first capacitor digital-to-analog converter (CDAC), the method comprising:
sampling a first analog signal onto the first CDAC using a sampling switch, and converting the sampled first analog signal into a first digital value;
storing the first digital value in the first CDAC to produce a second analog signal;
sampling the second analog signal converting the sampled second analog signal into a second digital value; and
providing a corrected digital value based on the difference between the first digital value and the second digital value.

8. The method of claim 7 further comprising providing a digital error correction value to the input of the first CDAC to reduce an additive error introduced by sampling.

9. The method of claim 7 further comprising loading an upper portion of the first CDAC with a digital value based on the conversion of the first analog signal to a first digital value, then converting the second analog signal to a second digital value using a lower portion of the first CDAC.

10. The method of claim 9 further comprising providing a digital error correction value to the input of the lower portion of the first CDAC to reduce an additive error introduced by sampling.

11. The method of claim 7 further comprising coupling a second CDAC to the first CDAC and converting the second analog signal to a second digital value is performed using the second CDAC.

12. The method of claim 11 further comprising providing a digital error correction value to the input of the second CDAC to reduce an additive error introduced by sampling.

13. The method of claim 7 wherein the first digital value includes a first additive error introduced by sampling the first analog signal, the second digital value includes a second additive error introduced by sampling the second analog signal, and the first additive error and the second additive error include contributions from a pedestal effect.

14. An analog-to-digital conversion system for converting an analog signal to a digital value and providing error correction, the system comprising:
a first capacitor digital-to-analog converter (CDAC) configured to sample a first analog signal, the sampling introducing a first additive error to the sampled first analog signal;
an analog-to-digital converter (ADC) configured to convert the sampled first analog signal to a first digital value, the converting introducing a second additive error to the first digital value;
a second CDAC configured to sample a third additive error created by the closing and re-opening of a sampling switch, wherein the ADC converts the sampled third additive error to a second digital value, the converting introducing a fourth additive error to the second digital value; and
a summation circuit configured to provide a corrected ADC digital value based on the difference between the first digital value and the second digital value.

15. The system of claim 14 wherein the second CDAC is further configured to receive an error correction value based on digitally filtered second digital values.

16. The system of claim 14 wherein the first additive error is approximately equal to the third additive error and the second additive error is approximately equal to the fourth additive error.

17. The system of claim 14 wherein the first CDAC includes capacitive elements corresponding to n digital bits and the second CDAC includes capacitive elements corresponding to m digital bits, and n is greater than m.

18. An analog-to-digital conversion system for converting an analog signal to a digital value and providing error correction, the system comprising:
a capacitor digital-to-analog converter (CDAC) configured to sample a first analog signal, the sampling introducing a first additive error to the sampled first analog signal;
an analog-to-digital converter (ADC) configured to convert the sampled first analog signal to a first digital value, the converting introducing a second additive error to the first digital value;
wherein a lower portion of the CDAC is then re-configured to sample a third additive error created by the closing and re-opening of a sampling switch, wherein the ADC converts the sampled third additive error to a second digital value, the converting introducing a fourth additive error to the second digital value; and
a summation circuit configured to provide a corrected ADC digital value based on the difference between the first digital value and the second digital value.

19. The system of claim 18 wherein the lower portion of the CDAC is further configured to receive an error correction value based on digitally filtered second digital values.

20. The system of claim 18 wherein the first additive error is approximately equal to the third additive error and the second additive error is approximately equal to the fourth additive error.

* * * * *